United States Patent [19]

Anderson et al.

[11] Patent Number: 4,818,382

[45] Date of Patent: Apr. 4, 1989

[54] DISC SINGULATOR

[75] Inventors: Richard A. Anderson, Maple Grove; Gerald R. Bowe, Blaine, both of Minn.

[73] Assignee: Micro Component Technology, Inc., Shoreview, Minn.

[21] Appl. No.: 750,260

[22] Filed: Jul. 1, 1985

[51] Int. Cl.[4] ........................ B07C 5/344; G01R 31/26

[52] U.S. Cl. .................................. 209/573; 198/470.1; 198/481.1; 221/235; 324/158 F

[58] Field of Search ............... 209/571, 573, 574, 909, 209/910; 324/73 AT, 158 F; 198/470.1, 473.3, 478.1, 481.1; 221/233, 235, 217, 220, 266

[56] References Cited

U.S. PATENT DOCUMENTS

| | | | |
|---|---|---|---|
| 2,567,741 | 9/1951 | Smith | 209/574 |
| 3,384,236 | 5/1968 | Best et al. | 209/573 X |
| 3,655,041 | 4/1972 | Baker et al. | 209/573 |
| 3,750,878 | 8/1973 | Atchley et al. | 209/573 X |
| 3,893,557 | 7/1975 | Frenk . | |
| 3,980,553 | 9/1976 | Quinn | 209/573 X |
| 4,128,174 | 12/1978 | Frisbie et al. | 209/573 |
| 4,324,600 | 4/1982 | Bankes et al. | 209/573 X |
| 4,436,619 | 3/1984 | Petrov et al. | 209/573 |

FOREIGN PATENT DOCUMENTS

| | | | |
|---|---|---|---|
| 1591868 | 10/1970 | Fed. Rep. of Germany | 209/573 |
| 46-35575 | 10/1971 | Japan | 324/158 F |
| 0299045 | 5/1971 | U.S.S.R. | 324/158 F |
| 0548911 | 3/1977 | U.S.S.R. | 209/573 |
| 0578662 | 10/1977 | U.S.S.R. | 324/158 F |
| 2098160 | 11/1982 | United Kingdom | 198/470.1 |

OTHER PUBLICATIONS

"*Testing and Sorting Apparatus*", Western Electric Technical Digest No. 35, R. M. Filek, P. L. Herr, D. M. Large, Jul. 1974, pp. 19–20.

*Primary Examiner*—Randolph A. Reese
*Assistant Examiner*—Edward M. Wacyra
*Attorney, Agent, or Firm*—Lawrence M. Nawrocki

[57] ABSTRACT

The invention of the present document is an improved disc singulator (10) for use in singulating and delivering to a test site (12) an integrated circuit device (14) to be tested by a tester mechanism. The singulator (10) includes structure to positively hold the device (14) within slots (64) formed in the periphery (52) of the disc (10) as it is rotated. A main body portion (16) of the device (14) is, thereby, held so that a plane defined by the main body (16) is oriented generally orthogonal to a plane defined by the disc (10). Additionally, the device (14) is held at an appropriate radial location with respect to the disc (14) so that, as the disc (10) rotates the device (14) carried thereby through a slit (40) in a printed circuit board (36) at the test site (12), contacts (26) of the device (14) will engage corresponding probes (38) at the test site (12). A wire spring (124) is employed to orient the main body portion (16) of the device (14) within a slot (64) in the disc (10) to prevent canting of the device (14). A plunger (86) and latch (132) are employed to assure proper radial positioning.

4 Claims, 2 Drawing Sheets

DISC SINGULATOR

TECHNICAL FIELD

The present invention deals broadly with the field of integrated circuits and devices for testing such electronic components in order to ascertain the integrity and overall quality thereof. More narrowly, however, the present invention relates to structures of handlers which function to singulate (that is, to identify and release) an individual integrated circuit device to be tested at a test site interfacing with a tester. A preferred embodiment of the invention is directed to a rotary disc structure which is utilized to effect the singulation function.

BACKGROUND OF THE INVENTION

Various types of handlers for maneuvering integrated circuit devices to a test site interfacing with a tester mechanism are known in the art and are commercially available. Such handlers vary in construction and design depending upon the type of integrated circuit to be handled, the desired speed of handling, etc. Handlers vary from manual and/or semiautomatic structures which provide basic input and output movement of devices to be tested across a test site, to sophisticated, essentially fully automated systems capable of communicating with a host computer. While less sophisticated apparatus are capable of handling a relatively limited number of devices per unit time, more sophisticated mechanisms are capable of a throughput significantly in excess of apparatus which were state-of-the-art only a few years ago.

Optimally, a handler mechanism should possess a sufficient speed of operation so as to be economical in use. Various handler structures have, therefore, sought to maximize throughput by use of a number of different approaches.

The approach employed has, to some degree, been dependent upon the type of integrated circuit device being handled. Various of such devices are known and utilized in commerce and industry. The particular application to which a device is put can vary widely.

A first type of device is known as a dual in-line package (DIP). Such a device has a platen-like main body portion which houses the integrated circuitry of the device. The main body portion of such devices are, typically, rectangular in shape, opposite edges of the main body portion carrying a plurality of elongated contacts substantially parallel to one another and generally perpendicular to a plane defined by the main body portion. Typically, rows of such contacts extending from opposite edges are flared slightly outwardly away from each other. A DIP, therefore, tends to take the form of a spider-like structure.

A second type of integrated circuit device known in the art is characterized as a small outline integrated circuit (SOIC). Such devices are quite similar in appearance to DIPS. They include a platen-like main body portion, often square in shape, which has a row of contacts extending from opposite edges thereof. While in the case of DIPS, the contacts are substantially straight, SOIC contacts typically have distal portions angled from the rest of the contacts so as to be disposed generally parallel to a plane defined by the main body portion of the device of which they are a part.

A final relevant type of integrated circuit device known in the prior art is characterized as a plastic leaded chip carrier (PLCC). A PLCC has contact pads rather than probes extending from a main body portion, the pads comprising an integral part of the shape thereof. The contacts are, typically, disposed about the periphery of the main body portion. In some cases, the device is "castled" by the presence of the contact pads.

Certainly, in the case of PLCCs, the contacts are rigid. As previously indicated, they form an integral part of the shape of the main body portion of the device of which they are a part. In the case of DIPs and SOICs, however, the contact probes also have some measure of rigidity.

Because of this measure of rigidity, some handlers have been enabled to use a rotary shuttle type singulator wherein a device is introduced into a station in the shuttle at one location and the shuttle rotated so that the contacts of the device will be brought into engagement with probes at a test site. Typically, the test site probes are of such a construction so that they will flex outwardly as the device passes therebetween.

Illustrative of a structure similar to that described above is that disclosed in U.S. Pat. No. 3,655,041 (Baker et al). In the Baker et al patent, however, the test site probes are mounted to a pair of arms, each arm being disposed for rotation about a pivot pin. Cam actuation effects engagement of the test site probes with the contacts of the device to be tested when a device is in position at the test site. The arms are rotated about their respective pivot pins to bring the probes into engagement with the contacts of the device.

U.S. Pat. No. 4,128,174 (Frisbie et al) is another prior art reference which illustrates the use of a rotary shuttle-type device having a plurality of stations disposed about the periphery thereof. As best seen in FIG. 2 of that reference, an integrated circuit device such as a DIP can be received within one of the stations and passed between a pair of probe rows at the test site. The resiliency of both the contacts and the probes allows the device to be tested to pass after the testing operation has been performed.

As seen in both of those patent references, however, the device to be tested is not positively held at the station in which it is received at the periphery of the rotary shuttle. Consequently, the device can become canted within the station, improperly positioned radially with respect to the shuttle, or misaligned in some other manner. As a result, a particular contact of the device may not be brought into engagement with the proper probe at the test site. Alternatively, even if a particular contact is brought into engagement with its proper probe, all contacts might not be brought into engagement with their respective probes at the same time.

It is to these problems and desirable features dictated by the prior art that the present invention is directed. It is a disc singulator device which positively holds a device to be tested in a desired orientation and at a particular, desired location with respect to the test site probes. As a result, more reliable testing can be effected.

SUMMARY OF THE INVENTION

The present invention is an improved mechanism for singulating integrated circuit devices so that they can be introduced at a test site. The mechanism is intended for use with integrated circuit devices having a generally rectangular platen-like main body portion and a plurality of contacts carried by the main body portion along opposite edges thereof. Typically, a test site includes a plurality of resilient probes which engage the contacts of the device to be tested as it passes through the test site. The mechanism includes a disc which has a pair of oppositely facing surfaces. The disc has at least one slot formed therein, which slot extends radially inwardly from the periphery of the disc. The disc is provided with a thickness and the slot with an angular dimension so as to be able to receive an integrated circuit device in the slot with the contacts of the main body portion of the device along opposite edges of the main body portion extending beyond the surfaces of the disc. The disc is mounted for rotation so that, as it rotates, an integrated circuit device received in the slot is passed through the test site. Means are provided for holding an integrated circuit device in the slot so that a plane defined by the main body portion of the device is oriented substantially mutually perpendicular to a plane defined by the disc. Further, the holding means effects disposition of the device to be received in the slot relative to the disc so that, as the disc is rotated, each contact of the device will engage and wipe past a corresponding one of the resilient probes at the test site.

In a preferred embodiment, the disc is formed by mounting two walls, or plates, in a closely parallel relationship so that a gap is defined between those plates. The integrated circuit device received within the slot can be held in the desired orientation by providing a wire spring secured within the gap against dislodging. The spring includes a surface which can be brought to bear upon one of oppositely facing surfaces of the main body portion of the device to be tested in order to urge the device into frictional engagement with an edge of the slot proximate the other of the oppositely facing surfaces of the device.

While such structure tends to maintain the device in a particular desired orientation, means can be provided to maintain, for example, an SOIC at a particular radial positioning with respect to the disc. Such means can include a plunger disposed for generally radial reciprocation along an axis generally parallel to the axis of elongation of the slot. The plunger can carry a finger received in the slot so that, as the plunger reciprocates, the finger will correspondingly reciprocate within the slot. The plunger, and, in turn, the finger carried thereby, can be biased radially outwardly with respect to the disc to a point at which the distal end of the finger is flush with the periphery of the disc. As can be seen, such structure would tend to urge an integrated circuit device received within the slot radially outwardly and displace it from its position within the slot.

In order to prevent such an occurrence other than when the slot is in registration with a discharge passage, a latch mechanism can be provided. The latch would include a protrusion having shoulder, and be pivotably disposed in the gap between the disc plates for pivoting between a first position wherein the shoulder obstructs the entrance to the slot, and a second position wherein the shoulder is retracted to afford free entry to, and egress from, the slot. The latch can be biased toward its first position, biasing being effectuated by use of a second wire spring held within the gap between the plates. Such a wire spring would carry a surface engagable with a surface on the latch in order to urge it toward its first position.

The preferred embodiment envisions employment of a disc having three similarly sized and shaped slots formed in the disc and extending radially inwardly from the periphery thereof. The slots can be spaced angularly from one another at 120 degrees. A disc so structured can be utilized in a handler having a station at which integrated circuit devices are admitted to the singulator, a test site station, and a discharge passage station. Each of the three stations would be spatially disposed so that, when one of the slots is in registration with, for example, the device receiving station, each of the other slots would be in registration with either the test site station or the discharge passage station. As can be seen then, while a device in one slot proximate the test site is being tested, another slot is, concurrently, being emptied of the device formerly received therein, and the third slot is in registration with the admitting station at which it can receive another integrated circuit device to be tested.

The present invention is, therefore, an improved singulation mechanism which not only facilitates increased processing time during handler operations, but which also functions to positively hold the devices being tested in desired positions and orientations. More specific features and advantages obtained in view of those features will become apparent with reference to the DETAILED DESCRIPTION OF THE INVENTION, appended claims, and accompanying drawing figures.

DETAILED DESCRIPTION OF THE INVENTION

Figure 2:
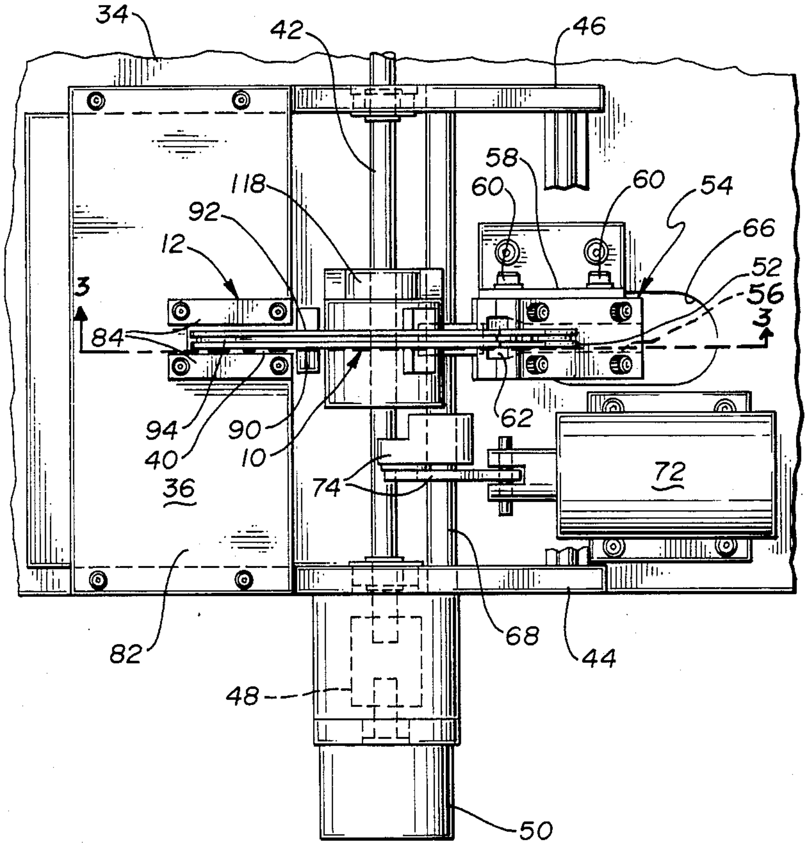
FIG. 2 is a top plan view of the disc singulator apparatus in accordance with the present invention.

Referring now to the drawings, wherein like reference numerals denote like elements throughout the several views, FIG. 2 illustrates apparatus including a singulator disc 10 in accordance with the present invention. Such a singulator 10 functions to identify and introduce at a test site 12 an integrated circuit device 14 of a type known in the prior art.

Figure 1:
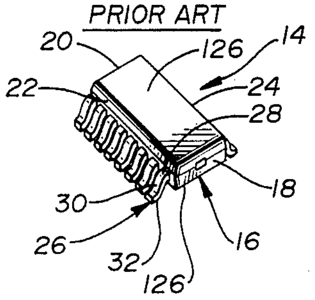
Fig.1 PRIOR ART
FIG. 1 is a perspective view of an SOIC device as known in the prior art.

FIG. 1 illustrates a small outline integrated circuit (SOIC) 14 which can utilize the present singulation invention. Such a device 14 includes a platen-like, rectangular main body portion 16. The main body portion 16 has leading and trailing edges 18, 20 and opposite lateral edges 22, 24, each of the lateral edges 22, 24 having, extending therefrom, a plurality of contacts 26. Each contact 26 has a first portion 28 extending outwardly from its respective edge 22, 24, a second portion 30 angled downwardly with respect to the first portion 28, and a distal portion 32 angled outwardly to lie substantially in a plane parallel to a plane defined by the main body portion 16.

It will be understood that the present singulation device 10 can be used with other types of integrated circuits such as dual in-line packages (DIPs) and plastic leadless chip carriers (PLCCs). While the contacts which are employed DIPs are structured differently than those employed by SOICs, the contacts employed by both devices are relatively rigid. Certainly, in the case of PLCCs there is virtually complete rigidity, since the contacts of such a device are formed as an integral part of the shape of the main body portion.

Referring again to FIG. 2, the singulation mechanism 10 is mounted to a base plate 34, as is other associated equipment. A printed circuit board 36 by which test signals are transmitted from a tester apparatus (not shown) to and from the test site 12 can be mounted above the base plate 34 and in parallel relationship thereto. The test site 12 having a plurality of probes 38 for engaging the contacts 26 of devices 14 to be tested is, in turn, carried on the printed circuit board 36. Probes 38 at the test site 12 are disposed on both sides of a slit 40 formed in the board 36 for engagement of contacts 26 on opposite edges 22, 24 of the main body portion 16 of a device 14 being tested. The test site 12 is illustrated in more detail in FIG. 8 and will be discussed in more depth with reference to that figure hereinafter.

The disc singulator 10 is mounted to define a plane generally orthogonal to a plane defined by the base plate 34, the singulator 10 being disposed for rotation on a shaft 42 journaled between two walls 44, 46 supporting the printed circuit board 36. One end of the shaft 42 is driven by a motor (not shown), and the other is mated by a coupling 48 to a counter mechanism 50 which verifies, by measuring number of disc rotations, the number of integrated circuit devices tested. With the disc 10 so mounted, it is positioned so that, as it rotates, its periphery 52 passes through the slit 40 in the printed circuit board 36 and between the probes 38 at the test site 12.

A chute 54 having a discharge passage 56 formed therein is mounted to a bracket 58 by appropriate means such as cap screws 60, and the bracket 58 is, in turn, mounted to the base plate 34 by similar securing means. The bracket 58 and chute 54 are secured to the base plate 34 at a location so that the mouth 62 to the passage 56 can be engaged by a slot or slots 64 formed in the periphery 52 of the disc 10 as the disc rotates. An aperture 66 through which integrated circuit devices, released into the discharge passage 56 from a slot 64 in the disc singulator 10, can pass to, for example, a classification bin or bins (not shown) can be provided in the base plate 34.

A second shaft 68 to which a pawl mechanism 70 (not seen in FIG. 2) is mounted is also journaled between the vertical side walls 44, 46. Rotation can be imparted to the shaft 68 by an actuator solenoid 72 and appropriate linkages 74.

Figure 3:
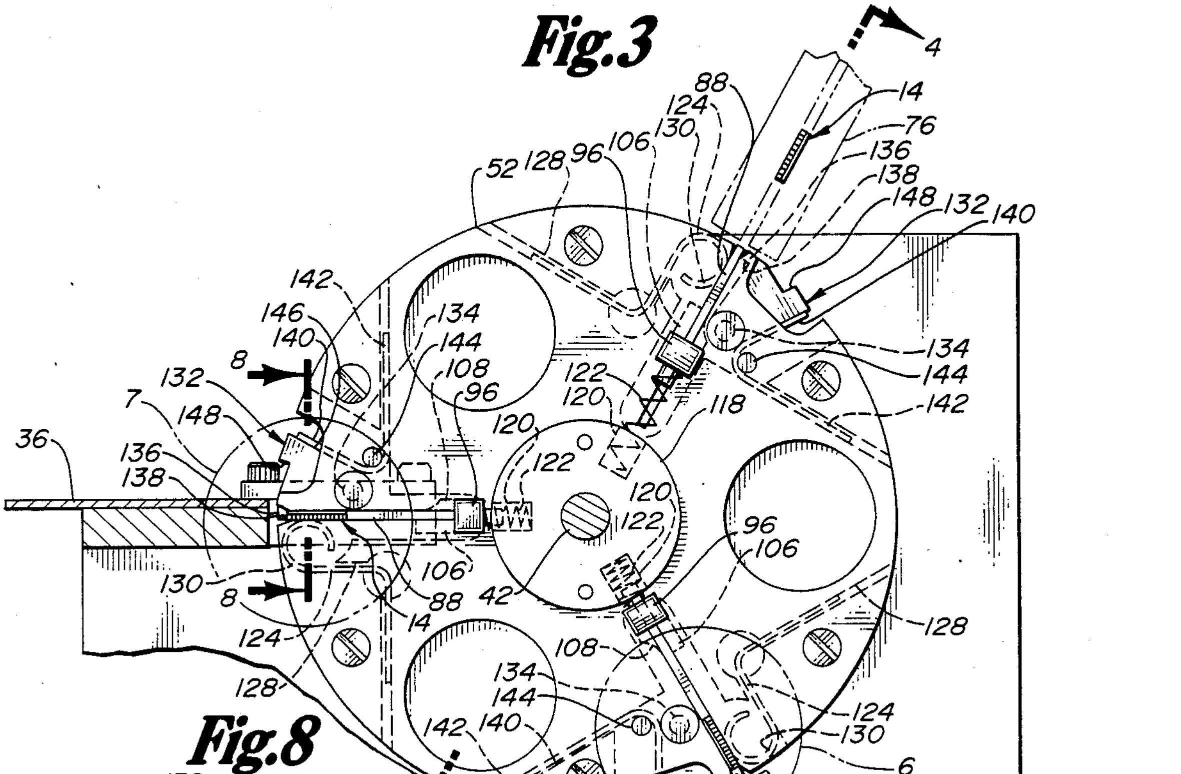
FIG. 3 is a sectional elevational view taken generally along the line 3—3 in FIG. 2, some parts thereof being removed.
Figure 3:
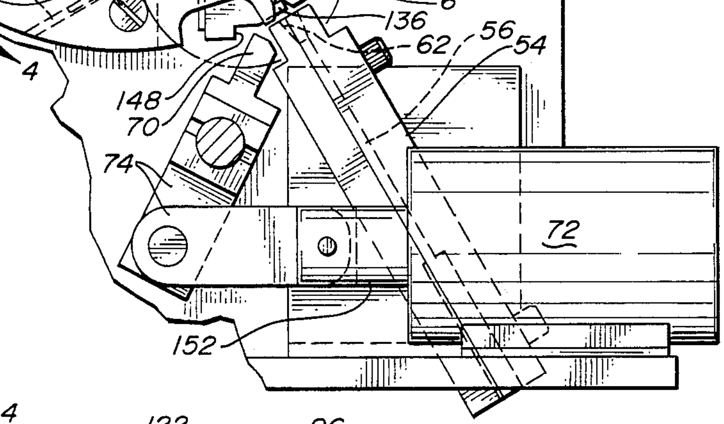

Referring now to FIG. 3, a preferred embodiment of the disc singulator 10 employs three separate slots 64, spaced at 120 degrees from one another, formed in the periphery 52 of the disc 10. Each slot 64 defines a position for receiving an integrated circuit device 14 from a feed station 76. The feed station 76 and the discharge chute 54 can be spaced angularly from one another and from the test site 12 so that, when one of the slots 64 in the disc 10 is in position at the test site 12 so that the contacts 26 of the device 14 in the slot 64 at the site 12 are contacted by the probes 38 providing communication to the tester, each of the other two slots 64 will be in registration with one of the feed station 76 and the discharge chute 54.

Figure 8:
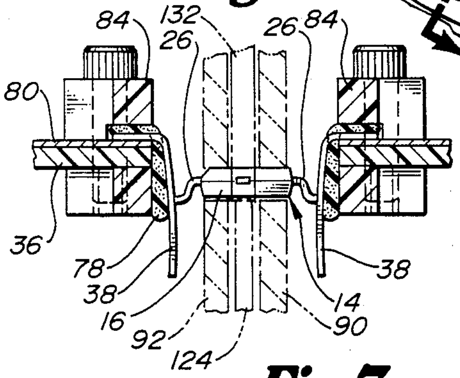
FIG. 8 is an enlarged sectional detail view taken generally along line 8—8 of FIG. 3, some parts of the disc singulator apparatus being shown in phantom.

FIG. 8 best illustrates the construction and placement of the components forming the test site 12 and the positioning of an integrated circuit device 14 carried by a slot 64 in the singulator 10 when the device 14 is in position at the test site 12. If the rotation of the disc 10 is downwardly through the test site 12, as it would most certainly be, since the test site station is desired to be sequentially immediately after the feed station, the probes 38 for engaging the integrated circuit device contacts 26 would extend downwardly. The probes 38 are resilient and are spaced from one another at a distance so that the contacts 26 of the device 14, as the device 14 enters the station, engage and abrade along portions of their respective probes 38 until in position. As seen in FIG. 8, the probes 38 can be provided with a foam backing 78 to more efficiently bias them inwardly toward each other.

The probes 38, in turn, communicate with the tester through traces 80 provided on the upwardly facing surface 82 of the printed circuit board 36. The probes 38 are held in position relative to the printed circuit board 36 by appropriate means such as clamping blocks 84.

Figure 7:
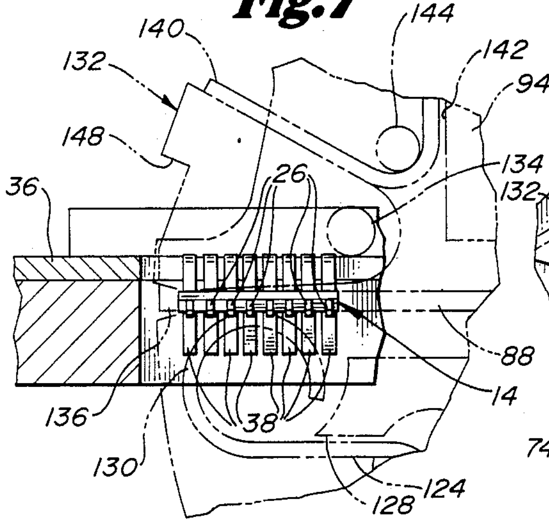
FIG. 7 is an enlarged elevational detail taken from the area encircled in FIG. 3 and identified at 7.

FIG. 8 illustrates a slot 64 in the periphery 52 of the disc 10 which has an angular dimension slightly greater than the thickness of the main body portion 16 of the integrated circuit device 14 being processed. This is to insure that the device 14 can be inserted radially inwardly into the slot 64. FIG. 3 illustrates slots 64 extending radially inwardly a distance significantly greater, by comparison, then the length of the device 14 being tested. It is desirable to so structure the slots 64 so that a single disc 10 can be used regardless of the size of the particular device 14 being tested. As can be seen in viewing FIGS. 7 and 8, because of the oversizing of the slots 64 with respect to dimensions of the main body portion 16 of integrated circuit devices 14, however, the devices 14 can become canted within the slots 64 within which they are received, and the contacts 26 can become misaligned with respect to the corresponding probes 38 at the test site 12 by which they are to be engaged.

The present invention, therefore, provides structure for holding a device 14 in a particular slot 64 in a desired orientation and position. With a disc 10 defining a plane orthogonal to that of the printed circuit board 36, it would, therefore, be optimum to hold the device 14 in the slot 64 in an orientation wherein a plane defined by the main body portion 16 thereof is perpendicular to the plane defined by the disc 10.

Figure 6:
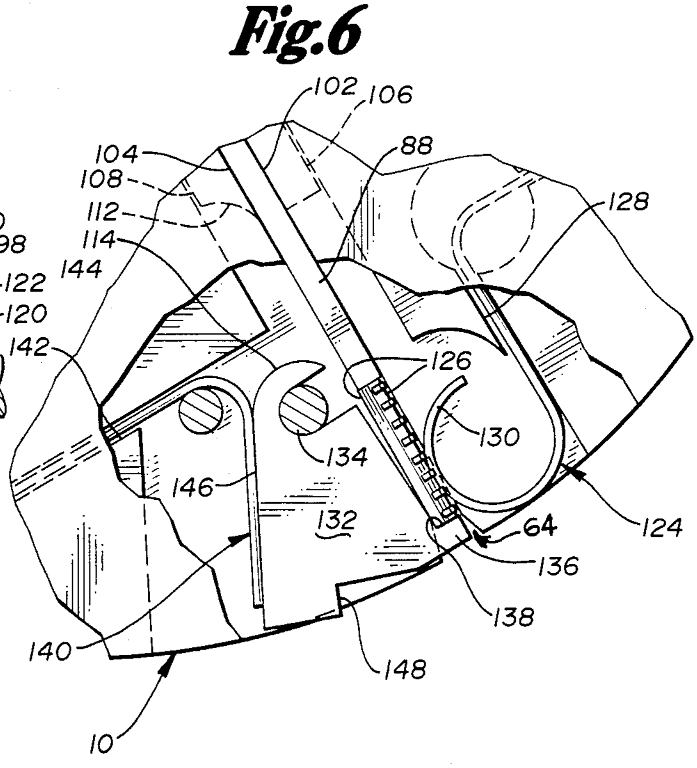
FIG. 6 is an enlarged elevational detail taken from the area encircled in FIG. 3 and identified at 6.

Referring now to FIG. 6, a plunger 86 carrying a finger 88 can be operatively positioned relative to the slot 64 so that the finger 88 is disposed for reciprocation within the slot 64. The finger 88, thereby, can define a radially inward limit beyond which an integrated circuit device 14 inserted into the particular slot 64 at the feed station 76 cannot pass.

Figure 5:
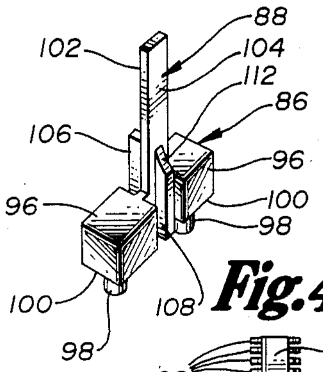
FIG. 5 is a detailed perspective view of a plunger/finger assembly.
Figure 4:
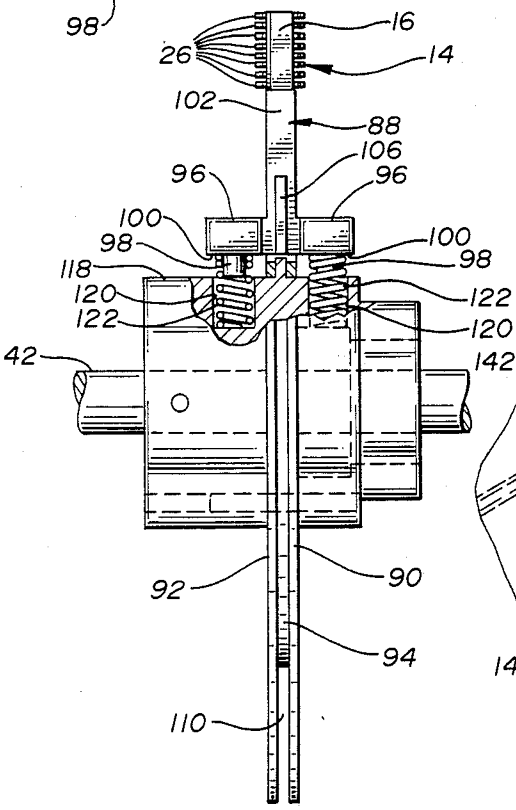
FIG. 4 is a sectional view taken generally along the line 4—4 of FIG. 3, some parts being removed for purposes of clarity.

FIG. 5 illustrates, in detail, the plunger/finger 86, 88 assembly, and FIG. 4 illustrates the manner in which it cooperates with the disc 10. Referring first to FIG. 4, the disc 10 can be formed by a pair of walls 90, 92 spaced in overlying relationship in close proximity to one another. The distance between the walls 90, 92 can be defined by variously sized and shaped spacers 94 holding the walls 90, 92 from one another at a fixed distance.

The plunger 86 includes, in combination, a pair of spring blocks, one on either side of the finger. Each spring block 96, in turn, is provided with a post 98 on a side 100 thereof so that, when the finger 88 is received within its respective slot 64, the post 98 will extend radially inwardly with respect to the disc 10.

Further, upper and lower sides 102, 104 of the finger 88 are provided with guides 106, 108 which ride in the gap 110 between the two walls 102, 104 when the finger 88 is received within its respective slot 64. A lower of the guides 108, at an end thereof radially outwardly, is provided with a concave surface 112 which can accommodate a corresponding convex surface 114 of a latch 132 which will be discussed hereinafter.

As seen in FIG. 4, a hub 118 at the central portion of the disc 10 is provided with a radially inwardly extending bore 120 on either side of each slot 64. When the plunger/finger assembly is received within its respective slot 64, the spring block posts 98 thereon will be aligned with a pair of these bores 120. A spring 122 can be received within each of these bores 120 at one end and encircle an aligned post 98 at the other end. The end encircling the post 98 is in engagement with the surface 100 of the spring block 96 to which the post 98 is mounted, and the springs 122 thus have the effect of biasing the plunger/finger assembly radially outwardly so that an integrated circuit device 14 received within the slot 64 will tend to be urged outwardly toward the periphery 52 of the disc 10.

An integrated circuit device 14 such as an SOIC to be introduced into one of the slots 64 in the disc 10 at the feeding station 76 will be forced downwardly at an angle to overcome the radially outward bias imparted to the plunger/finger assembly. The device 14 will be urged radially inwardly to a radial position at which its contacts 26 are angularly aligned with the probes 38 at the test site 12. As the disc 10 is rotated, therefore, the device's contacts 26 can be engaged by the probes 38.

Structure is provided not only to maintain the device 14 at this radial location, but also to maintain the device 14 so that a plane defined by its main body portion 16 is mutually perpendicular to a plane defined by the disc 10. The maintenance of this orthogonal relationship between the main body portion 16 and the disc 10 is accomplished by providing a first wire spring 124 to engage one of oppositely facing surfaces 126 of the main body portion 16. The spring 124 is held in a channel 128 defined between the two spaced walls 90, 92 forming the disc 10 and within a cut-out portion in the spacer 94. A distal end of the spring which engages the device is curved in a loop 130 so that damage will not be occasioned upon the main body portion 16 by any burr that might be present at the end of the spring 124. The loop 130 functions to urge the device 14 against an edge of the slot 64 in which the device 14 is received opposite the side on which the wire spring 124 is positioned.

A latch mechanism 132 is pivotally mounted in the gap 110 between the disc walls 90, 92 on a side of the slot 64 opposite that on which the first wire spring 124 is disposed. The latch 132 pivots about a post 134 defining an axis generally perpendicular to a plane defined by the disc 10. The latch 132 carries a protrusion 136 which defines a shoulder 138 to engage the radially outwardly end of the main body portion 16 of the SOIC 14 and, thereby, maintain the integrated circuit device 14 within the slot 64 when the latch 132 is pivoted to a position wherein the protrusion 136 occludes the slot 64.

Means can be provided to urge the latch 132 into a position wherein the protrusion 136 carried thereby is disposed to occlude the entrance to the slot 64. A second wire spring 140 can be utilized to effect this function. As in the case of the first wire spring 124, a portion of this wire spring 140 can be held within a channel 142 between the disc walls 90, 92 and defined by appropriately shaped portions of the spacer 94. The spring 140 can be bent around a post 144 and to a shape wherein, when it is positioned between the disc walls 90, 92, it will engage a surface 146 of the latch 132 and bias the latch 132 as desired.

Figure 9:
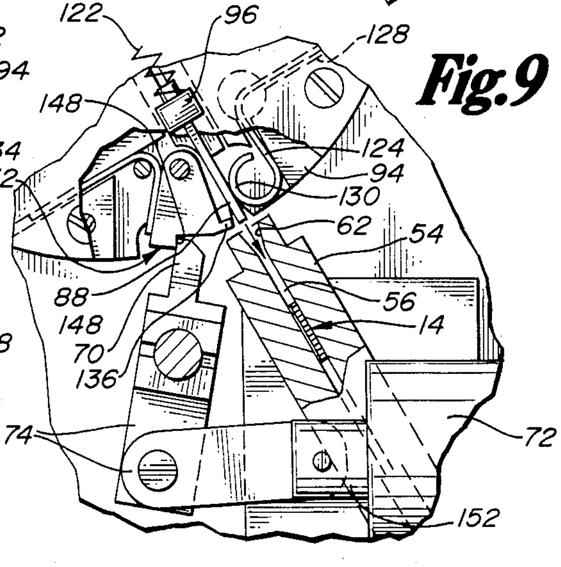
FIG. 9 is an enlarged view, similar to FIG. 6, with some parts being shown in secondary positions.

FIG. 6 illustrates the latch mechanism 132 as having a striker 148 to be engaged to retract the latch 132 from its position wherein the protrusion thereof occludes the entrance to the slot 64. As previously discussed, a solenoid 72 is provided to rotate a shaft 68 via appropriate linkages 74. The shaft 68, in turn, at a location spaced axially from the linkages 74, carries a pawl 70. The solenoid 72, when not actuated, is positioned wherein the shaft 68 is disposed angularly so that the pawl 70 does not obstruct rotation of the disc 10. Means (not shown) can be incorporated in the handler to ascertain the relative position of slots 64 in the disc singulator 10 relative to the feed station 76, the test site 12, and the discharge chute 54. When it is determined that a slot 64 in the disc 10 having an SOIC received therein is in position in registration with the discharge chute 54, a signal can be sent to the solenoid 72 to initiate activation thereof. An extension 152 from the solenoid 72 would retract upon actuation, and the shaft 68 would be caused to rotate counterclockwise as seen in FIGS. 3 and 9. The pawl 70 would, thereby, be rotated into engagement with the latch striker 148, and rotation of the pawl 70 would continue until the bias of the second wire spring 140 would be overcome and the latch protrusion 136 retracted to afford free egress from the slot 64 to the integrated circuit device 14 received therein. The device 14 would, thereafter, pass outwardly from the slot 64 and into the discharge passage 56.

In operation, the various slots 64 formed in the disc 10 would be devoid of integrated circuit devices 14 prior to actuation of the handler. One slot 64 would be in registration with the feeding station 76, a second in position at the test site 12, and the third in registration with the discharge passage 56. Each latch 132 would be held against closure by the respective cooperating plunger actuated finger 88, since the fingers 88 can be made to extend to positions flush with the periphery 52 of the disc 10. Forcing of devices 14 at the feeding station 76 downwardly to the point where one enters the registered slot 64 would drive the finger 88 radially inwardly. The device 14 entering the slot 64 would continue to be urged downwardly until it were at a depth within the slot 64 at which the latch 132 could be permitted to pivot so that the protrusion 136 of the latch mechanism 132 would occlude the entrance to the slot 64, and radially outwardly movement of the device 14 would be precluded by the shoulder 138 carried by the protrusion 136.

The disc 10 could then be rotated till the filled slot 64 were in position at the test site 12. With the device 14 in position at the test site 12 with the probes 38 of the site 12 engaging the contacts 26 of the device 14, testing would be conducted. Simultaneously, a second of the slots 64 in registration with the feed station 76 could be made to be occupied by a device 14 in the same manner as was the first slot.

After testing is completed, the disc 10 could be rotated so that the first filled slot could be brought into registration with the discharge passage 56. With this slot so positioned, the second slot would be at the test site 12 and the third slot would be in registration with the feeding station 76. While testing were being performed upon the device 14 in the second slot, the third slot could be filled in the manner as previously described. Simultaneously, the pawl 70 could be actuated to pivot the latch 132 cooperating with the first slot to retract the protrusion 136 carried thereby. The device 14 carried in the first slot would, thereby, be allowed to pass down the discharge passage 56. When the latch 132 were pivoted to retract the protrusion 136, the finger 88 would, thereby, be allowed to move radially outwardly in the slot 64 to a position at which its distal end would be flush with the periphery 52 of the disc 10. The slot 64 would, therefore, be configured for acceptance of another device 14 after the disc 10 is rotated so that it were in registration with the feeding station 76 again. Continuous singulation and testing can, thereby, be effected in this manner.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for singulating integrated circuit devices, each having a generally rectangular platen-like main body portion and a plurality of contacts carried by the main body portion along opposite edges thereof, for introduction at a test site including a plurality of resilient probes for engaging the contacts as the devices pass through the test site, comprising:

(a) a disc having a pair of closely spaced parallel walls defining a gap therebetween, and a slot, extending radially inwardly from a periphery of said disc, formed therein, said disc having a thickness and said slot being sized to receive an integrated circuit device in said slot with the contacts carried by the main body portion along opposite edges thereof extending beyond said spaced parallel walls of said disc;

(b) means for mounting said disc for rotation so that, as it rotates, an integrated circuit device received in said slot is passed through the test site and each contact of the device engages and wipes past a corresponding one of the resilient probes;

(c) a first wire spring held within said gap for urging the integrated circuit device received in said slot into frictional engagement with an edge of said slot;

(d) a plunger disposed for reciprocation along an axis generally parallel to an axis of elongation of said slot to urge an integrated circuit device received within said slot radially outwardly to overcome pressure exerted thereon by said first wire spring;

(e) means biasing said plunger radially outwardly with respect to said disc;

(f) a finger carried by said plunger for reciprocation therewith and received within said slot for movement therealong to a radially outermost position flush with said periphery of said disc;

(g) a latch, to oppose the radially outward urging by said plunger, carrying a shoulder, and being mounted for pivoting between a first position wherein said shoulder obstructs entry to, and egress from, said slot, and a second position wherein said shoulder is retracted to afford free entry to, and egress from, said slot; and (h) means urging said latch toward said first position thereof;

(i) wherein said finger, when in its radially outermost position, precludes movement of said latch from its second position to its first position.

2. Apparatus in accordance with claim 1 wherein said latch pivots about an axis substantially perpendicular to said plane defined by said disc.

3. Apparatus for singulating integrated circuit devices, each having a generally rectangular platen-like main body portion and a plurality of contacts carried by the main body portion along opposite edges thereof, for introduction at a test site including a plurality of resilient probes for engaging the contacts as the devices pass through the test site, comprising:

(a) a disc having oppositely facing surfaces and a slot formed therein extending radially inwardly from a periphery thereof, said disc having a thickness and said slot being sized to receive an integrated circuit device therein with the contacts carried by the main body portion along opposite edges thereof extending beyond said oppositely facing surfaces of said disc;

(b) means for mounting said disc for rotation so that, as it rotates, an integrated circuit device received in said slot is passed through the test site;

(c) a plunger within said slot disposed for reciprocation along an axis generally parallel to an axis of elongation of said slot for urging an integrated circuit device radially outwardly (d) means biasing said plunger radially outwardly;

(e) a finger carried by said plunger for reciprocation therewith and received within said slot for movement therealong to a radially outermost position flush with said periphery of said disc;

(f) a latch, to oppose the radially outwardly biased plunger, carrying a shoulder, and being mounted for pivoting about an axis substantially perpendicular to a plane defined by said disc, for movement between a first position wherein said shoulder obstructs entry to, and egress from, said slot, and a second position wherein said shoulder is retracted to afford free entry to, and egress from, said slot; and (g) means for urging said latch toward said first position thereof;

(h) wherein said finger, when in its radially outermost position, precludes movement of said latch from its second position to its first position.

4. Apparatus for singulating an integrated circuit device, having a generally rectangular, platen-like main body portion and a plurality of contacts carried by the main body portion along opposite edges thereof, from a string of such devices provided at a first station, introducing a device so singulated at a test site having a plurality of resilient probes for engaging the contacts as the device is passed through the test site, and discharging the device into a passage, comprising:

(a) a disc having oppositely facing surfaces, defined by closely-spaced parallel walls having a gap therebetween, and three slots formed therein, each extending radially inwardly from a periphery of said disc, said disc being mounted for rotation so that, when one of said slots is relatively positioned with respect to one of said first station, said test site, and said discharge passage, the other two slots are relatively positioned with respect to the other two of said first station, said test site, and said discharge passage;

(b) a first wire spring, associated with each slot and held within said gap, each of said first wire springs having a surface engagable with one of oppositely facing surfaces of the main body portion of the integrated circuit device received in the related slot, to urge an integrated circuit device in each of said slots into frictional engagement with an edge of the respective slot abutted by the other of the oppositely facing surfaces of the device;

(c) a plunger associated with each slot for urging an integrated circuit device received therein radially outwardly to overcome pressure exerted thereon by said first wire spring, said plunger including means biasing said plunger radially outwardly with respect to said disc;

(d) a latch for opposing the radially outward urging by said plunger associated with each slot, each of said latches carrying a shoulder, and being mounted for pivoting between a first position wherein said shoulder obstructs entry to, and egress from, a corresponding slot, and a second position wherein said shoulder is retracted to afford free entry to, and egress from, said corresponding slot;

(e) means for urging each of said latches toward its respective first position; and (f) a finger, carried by each of said plungers for reciprocation with its corresponding plunger, received within its corresponding slot for movement therealong to a radially outermost position flush with said periphery of said disc;

(g) wherein each of said fingers precludes movement of its corresponding latch from the latch's second position to its first position.

* * * * *